United States Patent [19]
Narita

[11] Patent Number: 5,875,086
[45] Date of Patent: Feb. 23, 1999

[54] SEMICONDUCTOR INTEGRATED CIRCUIT DEVICE EQUIPPED WITH PROTECTIVE SYSTEM FOR DIRECTLY DISCHARGING SURGE VOLTAGE FROM PAD TO DISCHARGE LINE

[75] Inventor: Kaoru Narita, Tokyo, Japan

[73] Assignee: NEC Corporation, Tokyo, Japan

[21] Appl. No.: 718,227

[22] Filed: Sep. 20, 1996

Related U.S. Application Data

[63] Continuation of Ser. No. 266,671, Jun. 28, 1994, abandoned.

[30] Foreign Application Priority Data

Jun. 30, 1993 [JP] Japan .................................... 5-188802

[51] Int. Cl.$^6$ ........................................................ H02H 9/04
[52] U.S. Cl. ............................................. 361/56; 361/111
[58] Field of Search ............................... 361/56, 54, 111, 361/91, 212, 220; 257/355

[56] References Cited

U.S. PATENT DOCUMENTS 5,189,588  2/1993  Yano et al. ................................ 361/56
5,212,618  5/1993  O'Neill et al. ............................. 361/56
5,233,448  8/1993  Wu ............................................ 361/56
5,287,241  2/1994  Puar ........................................... 361/56
5,290,724  3/1994  Leach ........................................ 437/51
5,343,352  8/1994  Nagamine ................................. 361/56

FOREIGN PATENT DOCUMENTS 3-72666  3/1991  Japan .

OTHER PUBLICATIONS

Patent Abstracts of Japan, Abstract of JP–A 3 072 666, Mar. 27, 1991.

*Primary Examiner*—Sally C. Medley
*Attorney, Agent, or Firm*—Sughrue, Mion, Zinn, Macpeak & Seas, PLLC

[57] ABSTRACT

A protective system incorporated in a semiconductor integrated circuit device has a shared discharging line and a plurality of protective circuits each having a diode and a lateral bipolar transistor coupled between an associated pad and the shared discharging line. Surge voltage applied to the pad is discharged through the associated protective circuit to the shared discharging line so that a main circuit is not destroyed by the surge voltage.

15 Claims, 10 Drawing Sheets

SEMICONDUCTOR INTEGRATED CIRCUIT DEVICE EQUIPPED WITH PROTECTIVE SYSTEM FOR DIRECTLY DISCHARGING SURGE VOLTAGE FROM PAD TO DISCHARGE LINE

This is a continuation of application No. 08/266,671, filed Jun. 28, 1994 now abandoned.

FIELD OF THE INVENTION

This invention relates to a semiconductor integrated circuit device and, more particularly, to a semiconductor integrated circuit device with a protective system against electrostatic destruction.

DESCRIPTION OF THE RELATED ART

A typical example of the protective system is disclosed in Japanese Patent Publication of Unexamined Application No. 3-72666. FIG. 1 illustrates a schematic layout of a prior art semiconductor integrated circuit device with the protective system.

A main circuit block 1 is assigned to internal circuits 1a of the integrated circuit, and circuit blocks 2 and 3 are assigned to output buffers 2a and 3a. The main circuit block occupies most of the real estate of a semiconductor chip where the integrated circuit is fabricated. The internal circuits are powered through a power supply terminal 4a and a ground terminal 5a, and an input signal is supplied from an input terminal 6a to the internal circuits 1a. The output buffers 2a and 3a are powered through respective power supply terminals 4b and 4c and respective ground terminals 5b and 5c, and output data signals are supplied from the internal circuits 1a through the output buffers 2a and 3a to respective output terminals 6b and 6c.

FIG. 2 illustrates the prior art protection system incorporated in the semiconductor integrated circuit device shown in FIG. 1. In the main circuit block 1, a power supply line 7a is looped for propagating the power voltage Vcc to the internal circuits 1a, and is connected with the power supply terminal 4a. An earth line 8a is also looped for discharging current to the ground terminal 5a, and the power supply line 7a and the earth line 8a are hatched in opposite directions of clear discrimination. A power supply line 7b and an earth line 8b extend from the power supply terminal 4b and the ground terminal 5b in the circuit block 2 so as to power the output buffer 2a, and the other output buffer 3a is powered through a power supply line 7c and an earth line 8c, respectively connected with the power supply terminal 7c and the ground terminal 5c. The power supply lines 7b and 7c are dotted for the sake of clear discrimination.

The prior art protective system comprises a plurality of switching transistors 9a to 9v. These switching transistors 9a to 9v discharge surge voltage or excess voltage to the earth line 8a and the power supply line 7a. For example, if the surge voltage over the potential at the ground terminal 5a is applied to the output terminal 6b, the switching transistor 9b turns on for discharging surge current to the earth line 8b. Thereafter, the switching transistors 9q and 9r turn on for further discharging the surge current to the earth line 8a. In this manner, the surge current is finally discharged to the ground terminal 5a.

If the surge voltage over the potential at the power supply terminal 4a is applied to the power supply terminal 4c, the switching transistors 9s and 9t turn on for transferring the surge current from the power supply line 7c to the earth line 8c. Thereafter the switching transistors 9u and 9v turn on for transferring the surge current from the earth line 8c to the earth line 8a. Finally, the switching transistors 9d to 9n turn on for discharging the surge current from the earth line 8a to the power supply line 7a, and the surge current is relayed to the power supply terminal 4a.

FIG. 3 illustrates the concept of the prior art protective system used for discharging the surge voltage applied to the power supply terminal 4c. The switching transistors 9s/9t, the switching transistors 9u/9v and the switching transistors 9d/9e/9f/9g/9h/9i/9j/9k/9m/9n are respectively represented by bipolar transistors 10a, 10b and 10c, because parasitic bipolar actions of the switching transistors 9s/9t, 9u/9v and 9d to 9n are used for clamping the associated power supply/earth lines at lower voltages than the surge voltage thereon.

Thus, the prior art protective system discharges the surge current through the earth line 8a at all times, and the switching transistors 9a to 9v are arranged in such a manner as to allow the surge current to flow through the earth line 8a.

A problem is encountered in the prior art protection system in that component field effect transistors of the internal circuits 1a are liable to be damaged due to the surge voltage. This is because the parasitic bipolar transistors 10a to 10c are equivalent to the three stages of the switching transistors produce large potential difference between nodes A1 and A2. The clamp voltage at each stage 10a, 10b or 10c is on the order of 7 volts. The total potential difference is estimated at 21 volts. The large potential difference is applied across the gate oxide films of component MOS (Metal-Oxide-Semiconductor) transistors incorporated in the internal circuits 1a. This difference and is much larger than the breakdown voltage of the gate oxide films as thin as 160 angstroms.

Another problem inherent in the prior art protective system is a trade-off between the effect against the surge voltage and the semiconductor chip size. If the switching transistors 9s/9t, 9u/9v and 9d to 9n are decreased to the switching transistors 9s, 9v and 9d, by way of example, the resistances R1 and R2 shown in FIG. 4 are increased, and the prior art protective system can not rapidly discharge the surge current. On the other hand, if the switching transistors coupled in parallel are increased, the surge current is rapidly discharged. However, the switching transistors occupy a large amount of real estate, and the manufacturer needs to enlarge the semiconductor chip.

SUMMARY OF THE INVENTION

It is therefore an important object of the present invention to provide a semiconductor integrated circuit device a protective system of which is effective against surge voltage.

To accomplish the object, the present invention proposes to directly discharge a surge current to a shared discharging line.

In accordance with the present invention, there is provided a semiconductor integrated circuit device fabricated on a semiconductor chip, comprising: a) a main circuit having an input port for receiving an input signal, and responsive to the input signal for producing an output signal; b) an output circuit having an output port for transferring the output signal to the outside of the semiconductor integrated circuit device; c) a power supply system having a first power supply sub-system for supplying a first power voltage and a second power voltage to the main circuit and a second power supply sub-system for supplying the first power voltage and the second power voltage to the output circuit, the first power supply sub-system having a first power supply port supplied with the first power voltage and a second power supply port supplied with the second power voltage, the second power supply sub-system having a third power supply port supplied with the first power voltage and a fourth power supply port supplied with the second power voltage, the first power supply port and the second power supply port being electrically isolated from the third power supply port and the fourth power supply port, the semiconductor chip being biased with the second power voltage; and d) a protective system having d-1) a shared discharging line for discharging a surge voltage through the semiconductor chip, and d-2) a plurality of protective units coupled between the shared discharging line and the input port, the output port, the first power supply port, the third power supply port and the fourth power supply port, and operative to discharge the surge voltage from the input port, the output port, the first power supply port, the third power supply port and the fourth power supply port to the shared discharging line and to keep respective standard voltage levels at the input port, the output port, the first power supply port, the second power supply port, the third power supply port and the fourth power supply port.

BRIEF DESCRIPTION OF THE DRAWINGS

The features and advantages of the semiconductor integrated circuit device according to the present invention will be more clearly understood from the following description taken in conjunction with the accompanying drawings in which.

DESCRIPTION OF THE PREFERRED EMBODIMENT

Figure 1:
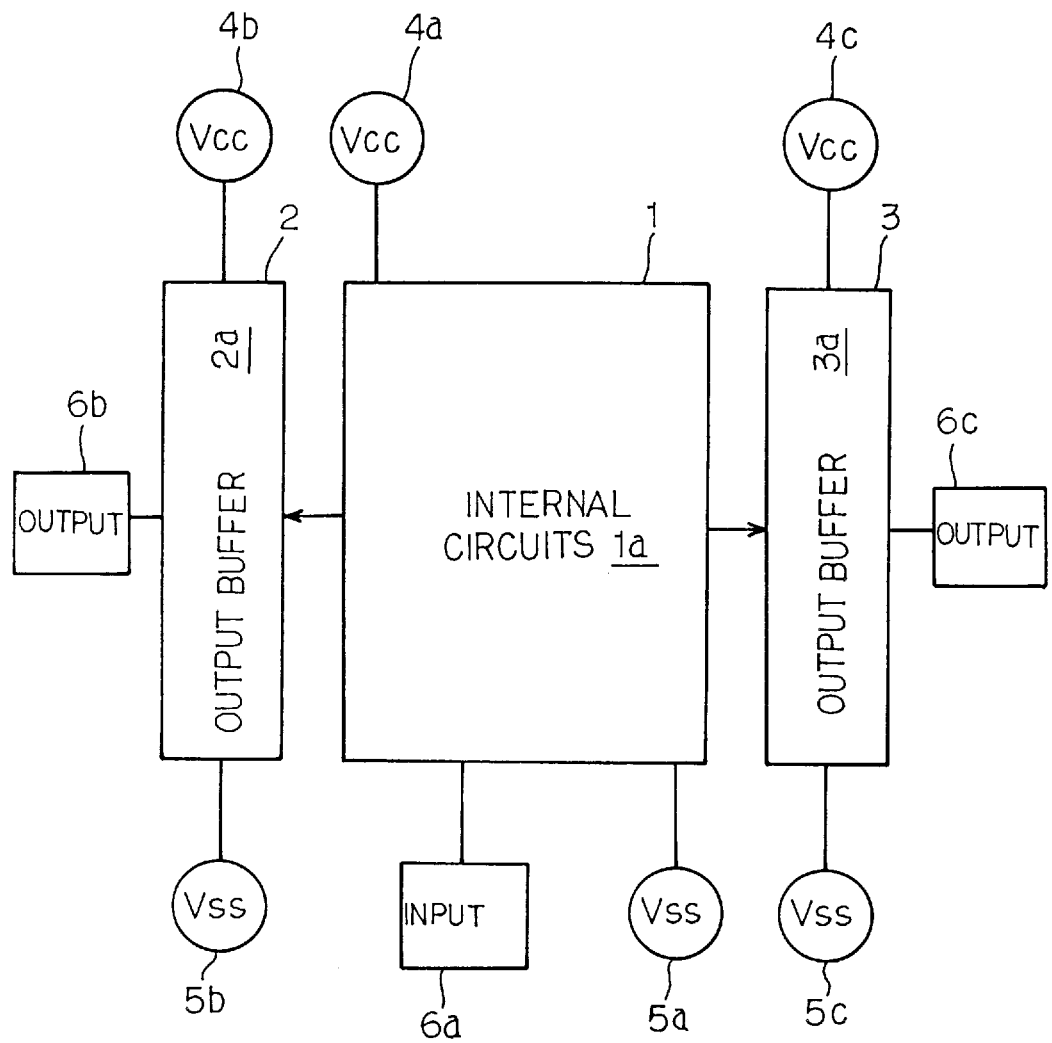
FIG. 1 is a block diagram showing the schematic layout of the prior art semiconductor integrated circuit device.
Figure 2:
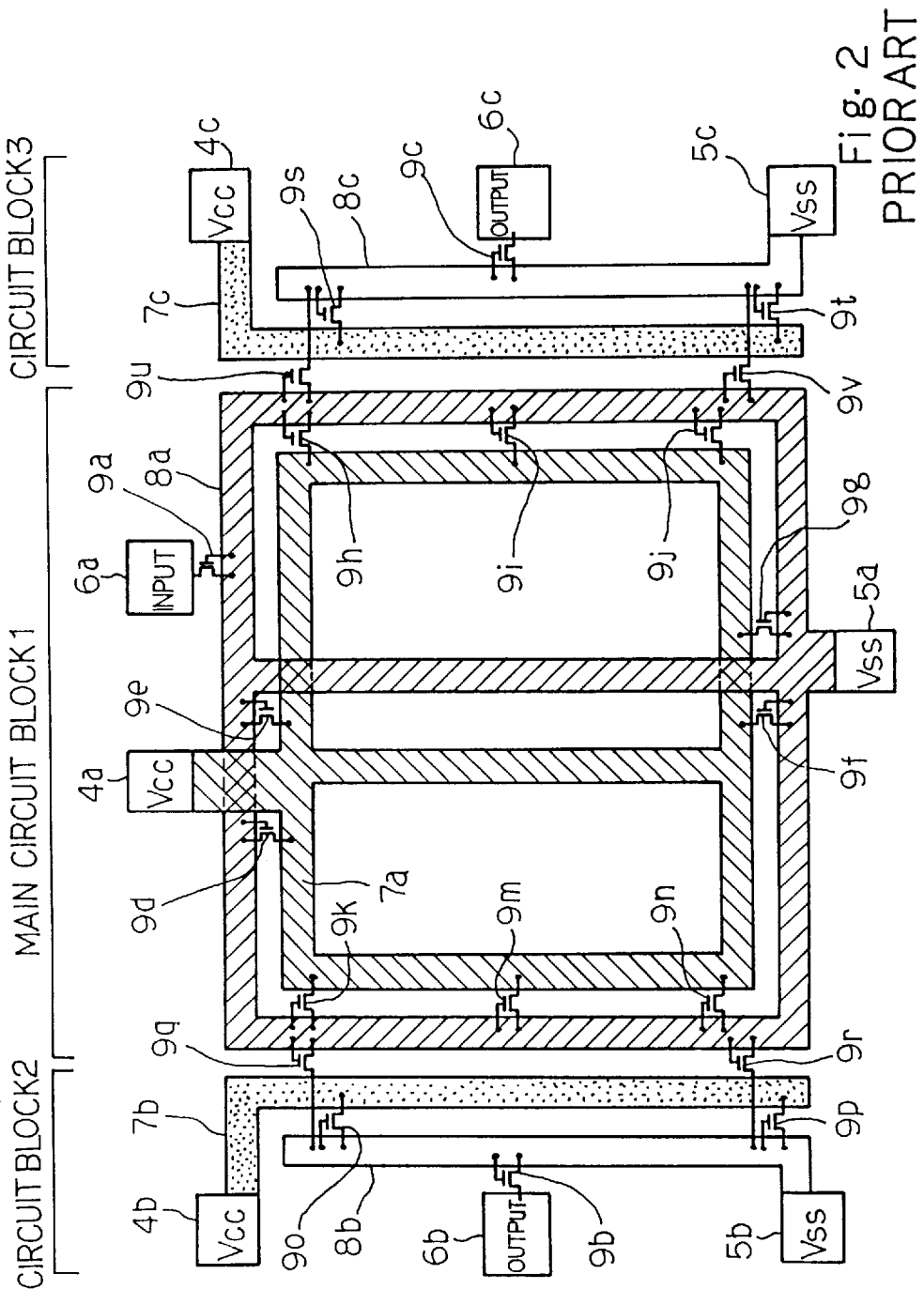
FIG. 2 is a plan view showing the protective system incorporated in the prior art semiconductor integrated circuit device.
Figure 3:
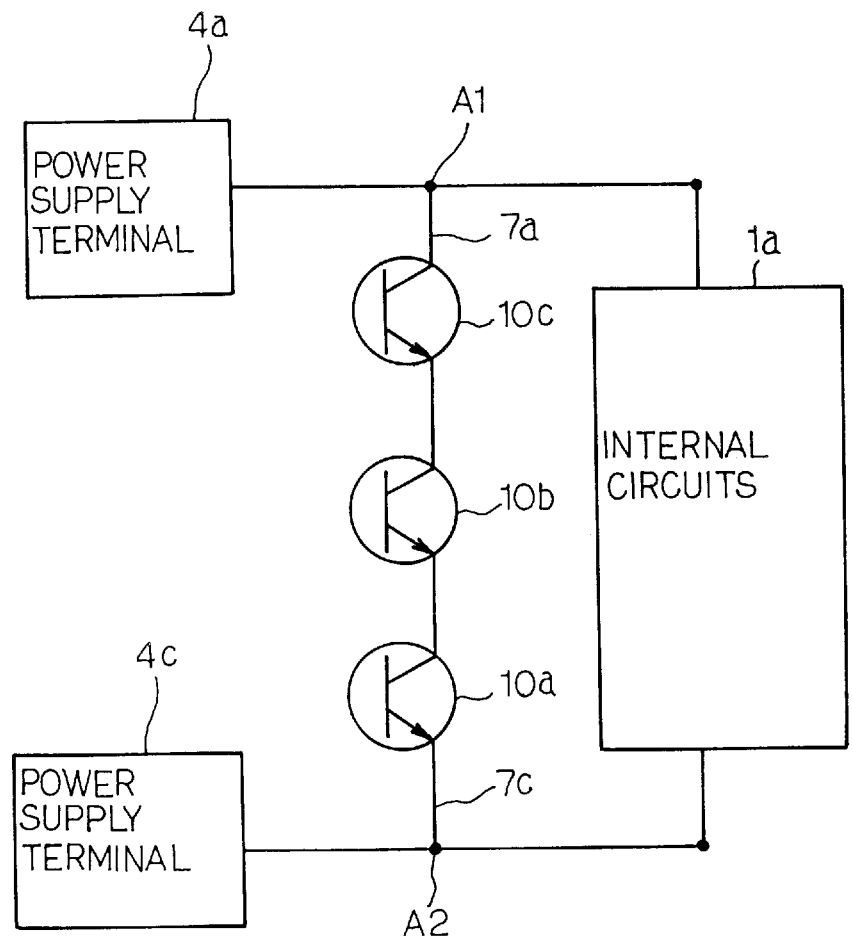
FIG. 3 is a block diagram showing the relationship between the internal circuits and the protective system both incorporated in the prior art semiconductor integrated circuit device.
Figure 4:
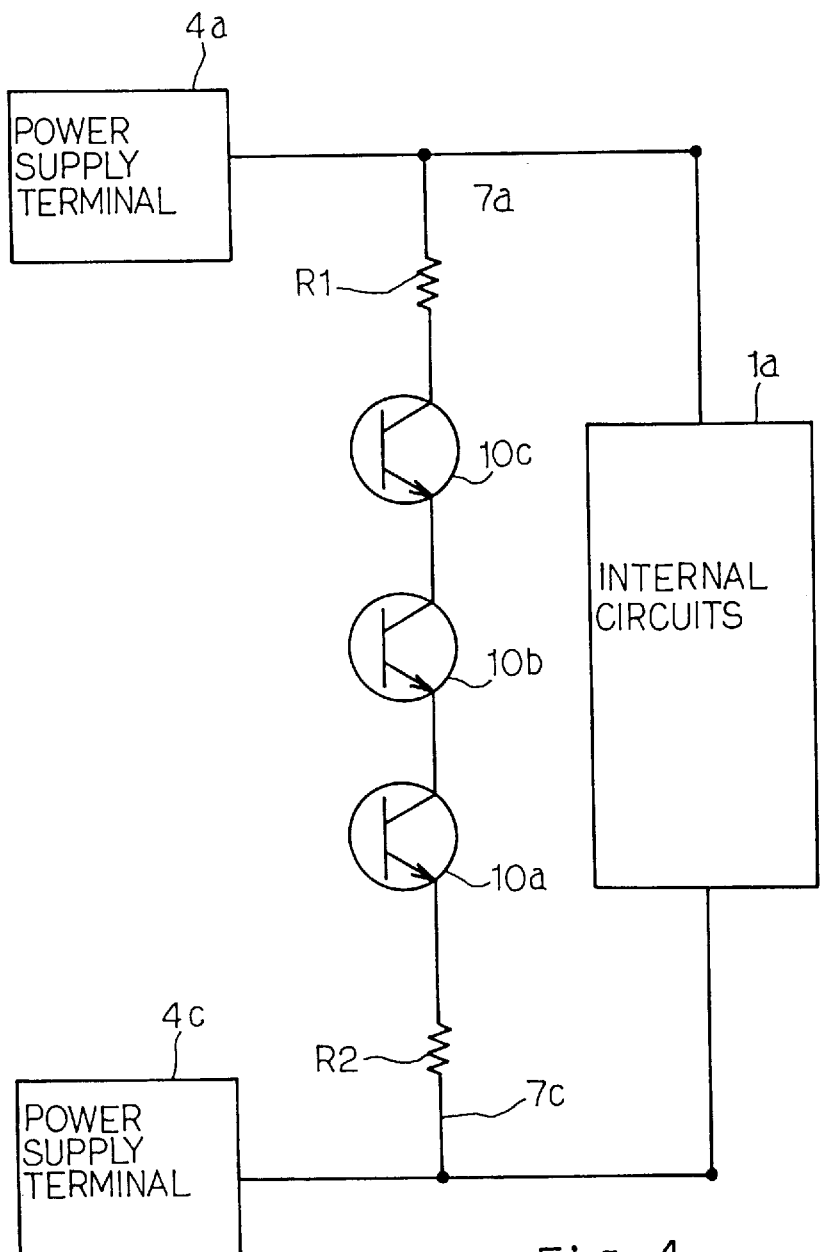
FIG. 4 is a block diagram showing the relationship between the internal circuits and the protective system both incorporated in the prior art semiconductor integrated circuit device.
Figure 5:
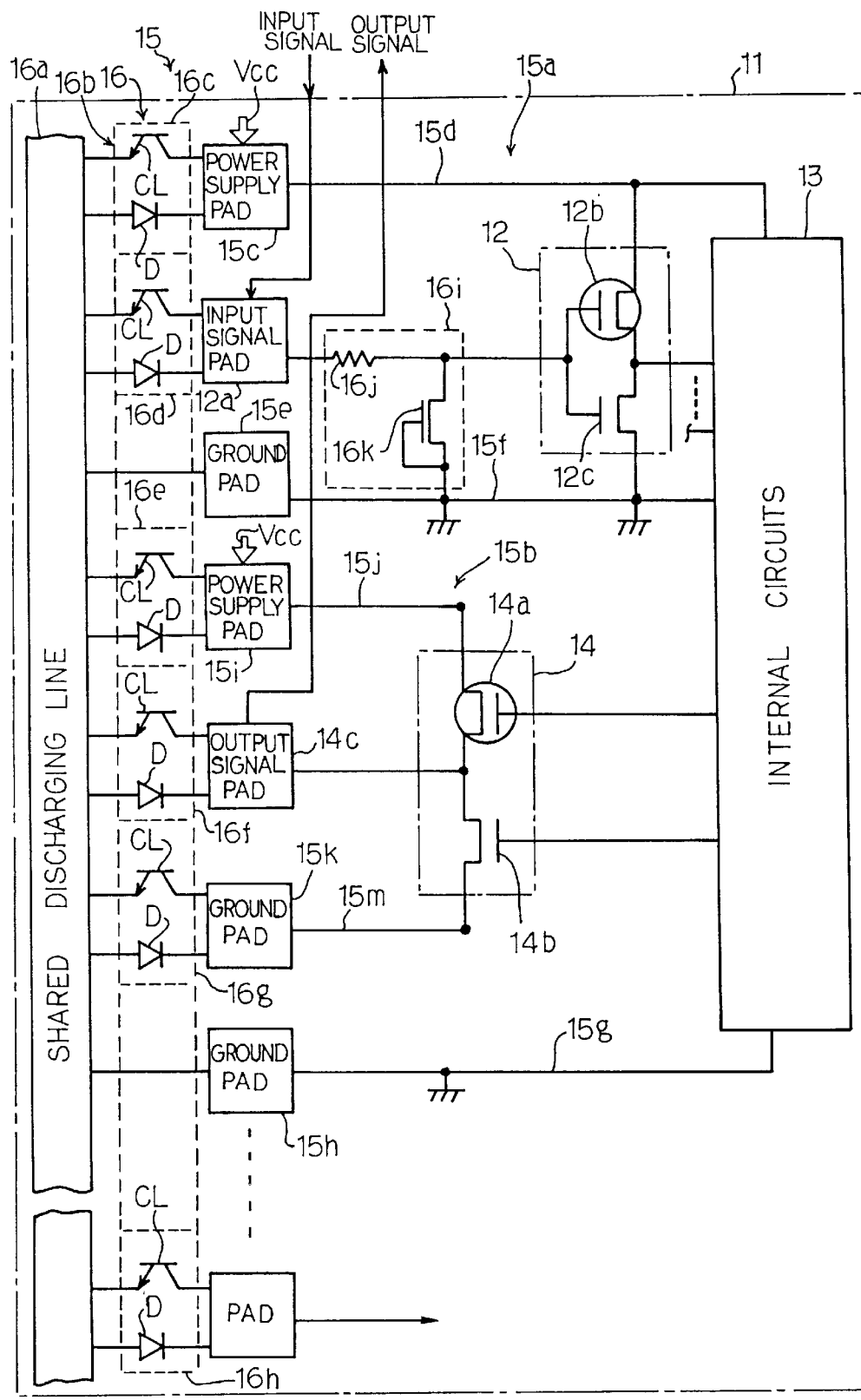
FIG. 5 is a circuit diagram showing the arrangement of a semiconductor integrated circuit device according to the present invention.

Referring to FIG. 5 of the drawings, a semiconductor integrated circuit device of the present invention is fabricated on a single semiconductor chip 11, and the ground voltage biases the semiconductor chip 11. The semiconductor integrated circuit device largely comprises an input buffer circuit 12, internal circuits 13, an output buffer circuit 14, a power supply system 15 and a protective system 16.

An input signal pad 12a is electrically connected with the input buffer circuit 12, and the input buffer circuit 12 temporally stores the input signal. The input signal is relayed to the internal circuits 13. In this instance, the input buffer circuit 12 is implemented by a series of a complementary inverter, i.e., a series of p-channel enhancement type switching transistor 12b and an n-channel enhancement type switching transistor 12c.

The internal circuits 13 are operative to carry out a predetermined function on the input signals for producing an output signal, and the output signal is supplied from the internal circuits 13 to the output buffer circuit 14. Although only one input buffer circuit 12 is illustrated in FIG. 5, other input signals are also supplied from input signal pads (not shown) through input buffer circuits (not shown) to the internal circuits, and the input pads and the input buffer circuits are similar to the input signal pad 12a and the input buffer circuits 12. The input signal pad 12a and the other input signal pads (not shown) form in combination an input signal port, and the input buffer circuit 12 and the other input buffer circuits (not shown) as a whole constitute an input buffer unit.

The output buffer circuit 14 is also implemented by a complementary inverter, i.e., a series of a p-channel enhancement type switching transistor 14a and an n-channel enhancement type switching transistor 14b, and temporally stores the output signal. The output buffer circuit 14 is coupled with an output signal pad 14c, and the output signal is transferred from the output buffer circuit 14 through the output signal pad 14c to the outside of the semiconductor integrated circuit device.

The power supply system 15 is broken down into two power supply subsystems 15a and 15b. The first power supply sub-system 15a comprises a power supply pad, or part, 15c supplied with a power voltage Vcc from the outside of the semiconductor chip 11, a power supply line 15d for distributing the power voltage Vcc to the input buffer circuit 12, the other input buffer circuits (not shown) and the internal circuits 13, a ground pad, or part, 15e for the ground voltage, a ground voltage line 15f shared between the input buffer circuit 12, the other input buffer circuits (not shown) and the internal circuits 13, an additional ground line 15g connected between the internal circuits 13 and an additional ground pad 15h and exclusively used by the internal circuits 13. Thus, the input buffer circuit 12, the other input buffer circuits and the internal circuits 13 are powered by the first power supply sub-system 15a, and the input buffer unit including the circuit 12 and the internal circuits 13 as a whole constitute a main circuit.

The second power supply sub-system 15b comprises a power supply pad, or part, 15i supplied with the power voltage Vcc, a power supply line 15j for propagating the power voltage Vcc to the output buffer circuit 14, a ground pad, or part, 15k for the ground voltage and a ground voltage line 15m assigned to the output buffer circuit 14. Thus, the second power supply sub-system 15b is independent from the first power supply sub-system 15a, and the main circuit is electrically isolated from the output buffer circuit 14, because the output buffer circuit 14 expected to drive a large amount of current may cause undesirable voltage fluctuation.

Figure 6:
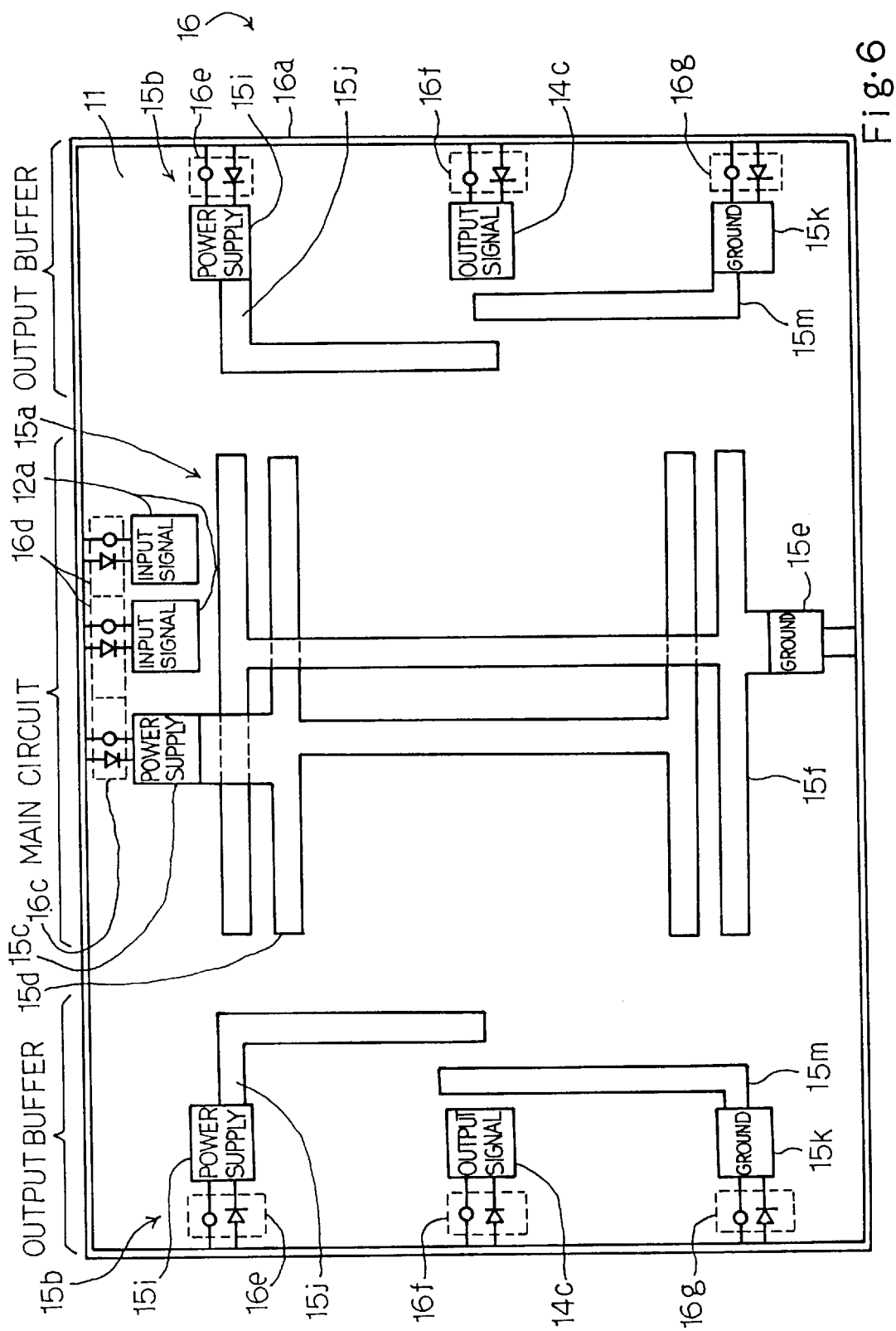
FIG. 6 is a plan view showing the arrangement of a power supply system and a protective system incorporated in the semiconductor integrated circuit device.

In this instance, the output buffer circuit 14 and the output signal pad 14c serve as an output circuit and an output signal port. Another semiconductor integrated circuit device may have more than one output buffer circuits respectively associated with output signal pads as shown in FIG. 6. If so, the plurality of output signal pads and the output buffer circuits form the output signal port and the output circuit, respectively.

The protective system 16 comprises a shared discharging line 16a, an array 16b of protective units 16c, 16d, 16e, 16f, 16g, 16h, . . . and an input protection circuit 16i. The shared discharging line 16a is connected through the array 16b with the pads 15c, 12a, 15i, 14c, 15k, . . . , and is directly connected with the ground pads 15e and 15h. The shared discharging line 16a extends along the outermost peripheral area partially in scribe lines (see FIGS. 6 and 7), and a scribe wiring held in contact with the semiconductor chip 11 serves as the shared discharging. The pads 15c, 12a, 15e, 15i, 14c, 15k, 15h, . . . are arranged in the vicinity of the scribe wiring. The scribe wiring is usually incorporated in any kind of semiconductor integrated circuit device and keeps the semiconductor chip 11 or the semiconductor substrate at a constant voltage (see FIG. 8). Namely, the scribe wiring 16a extends partially on an inter-level insulating layer 21 laminated on a thick field oxide layer 22 and is partially held in contact with a heavily doped p-type contact region 11a for forming an ohmic contact with the semiconductor chip 11. The shared discharging line 16a thus implemented by the scribe wiring does not increase the semiconductor chip size, nor makes the process sequence complex. The scribe wiring minimizes the length of the shared discharging line 16a, and a scribe wiring of aluminum is of the order of 3 ohms.

Turning back to FIG. 5, each of the protective units 16c to 16h has a diode D and a clamping element CL coupled in parallel between the shared discharging line 16a and the associated pad. While no surge voltage is applied to the pads 15c, 12a, 15i, 14c, 15k, . . . , the diodes D electrically isolate the pads from the shared discharging line 16a, and the pads are maintained at standard voltage levels such as the power voltage line Vcc, the ground voltage level and the input signal voltage. On the other hand, if surge voltage is applied to one of the pads, the clamping element CL discharges the surge current from the pad to the shared discharging line 16a.

Figure 7:
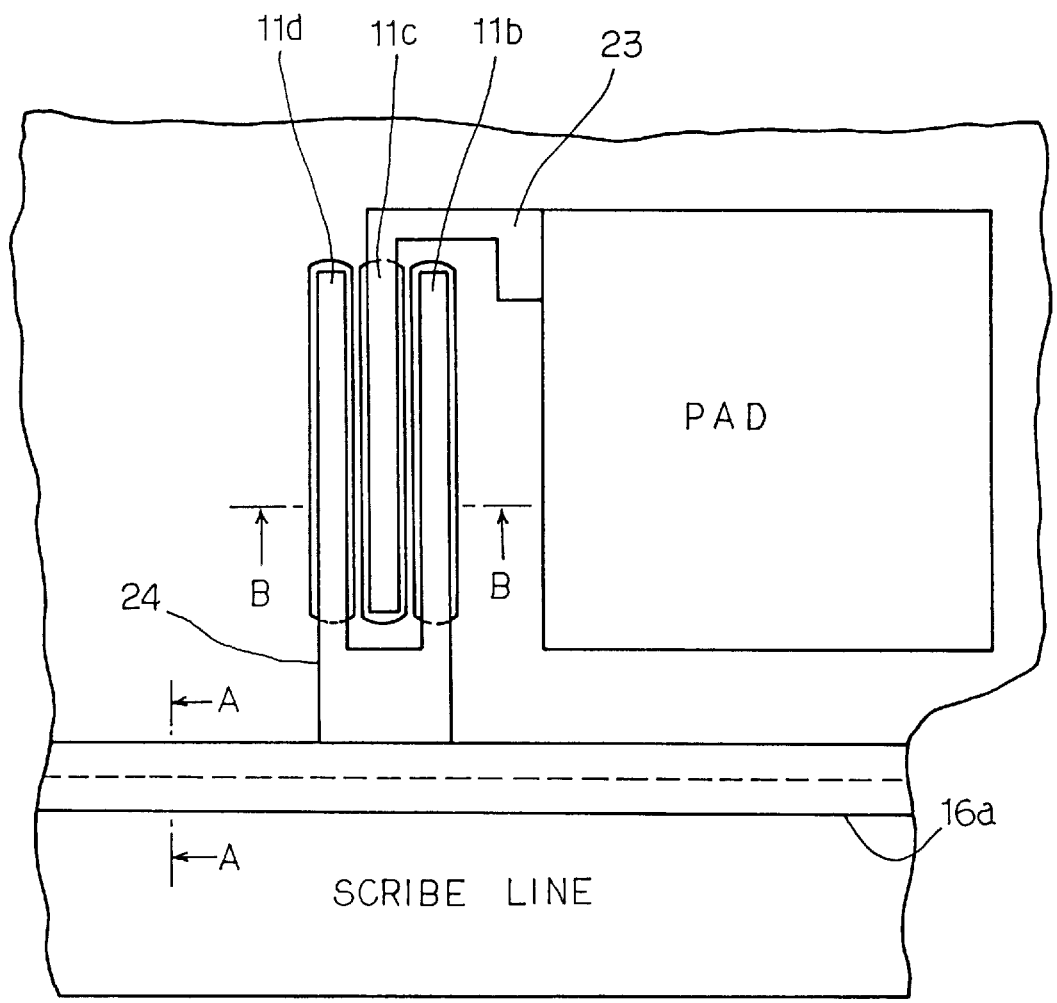
FIG. 7 is a plan view showing the layout of a protective unit incorporated in the semiconductor integrated circuit device.
Figure 8:
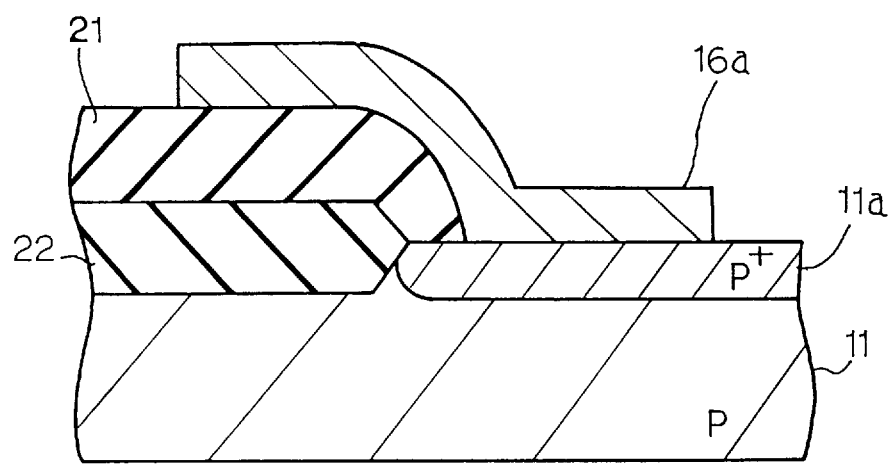
FIG. 8 is a cross sectional view taken along line A—A of FIG. 6 and showing a scribe line serving as a shared discharging line.
Figure 9:
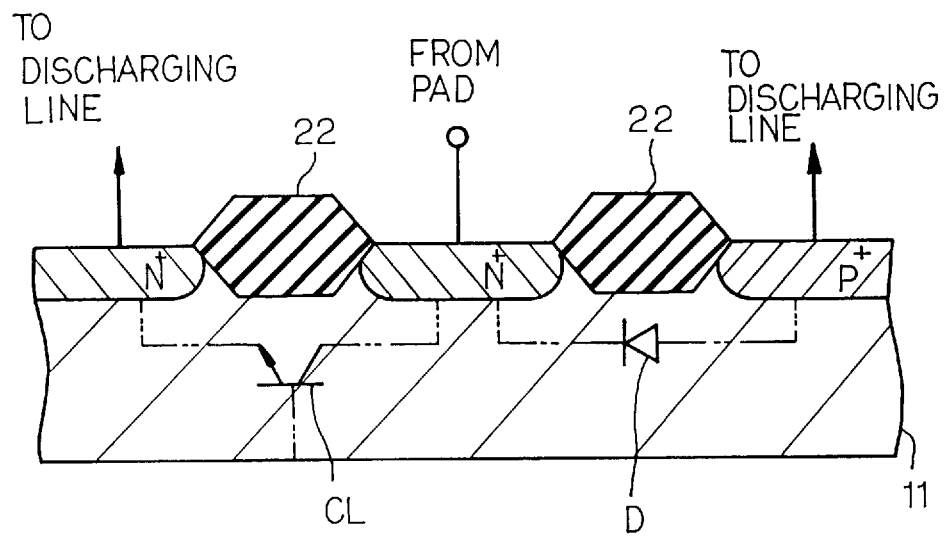
FIG. 9 is a cross sectional view taken along line B—B of FIG. 6 and showing the structure of the protective unit.

As will be better seen from FIGS. 7 and 9, the diode D is implemented by a heavily-doped p-type impurity region 11b/the p-type silicon substrate 11 and a heavily-doped n-type impurity region 11c, and the heavily-doped p-type impurity region 11b/the p-type silicon substrate 11 serve as an anode of the diode D. The heavily-doped n-type impurity region 11c, the p-type semiconductor substrate 11 and a heavily-doped n-type impurity region 11d form in combination a lateral bipolar transistor serving as the clamping element CL. Although contact holes formed in the inter-level insulating layer 21 are not shown in FIG. 6, the heavily-doped n-type impurity region 11c is connected with an aluminum wiring 23 with the associated pad, and the heavily-doped p-type impurity region 11b and the heavily-doped n-type impurity region 11d are connected with a bifurcated aluminum wiring 24 merged into the scribe wiring 16a.

Turning back to FIG. 5, the input protective circuit 16i comprises a resistor 16j and a discharging transistor 16k. The resistor 16j introduces time delay into the propagation of the surge voltage applied to the input signal pad 12a, and the discharging transistor 16k turns on in the presence of the surge voltage for directly discharging the surge current to the ground pad 15e. The clamping element may be implemented by a parasitic bipolar transistor of a MOS transistor, and the MOS transistor may be fabricated through a known CMOS process under 0.6-micron design rules. If so, the clamp voltage is of the order of 7 volts, and the build-in potential of the diode D is about 0.9 volt.

Figure 10A:
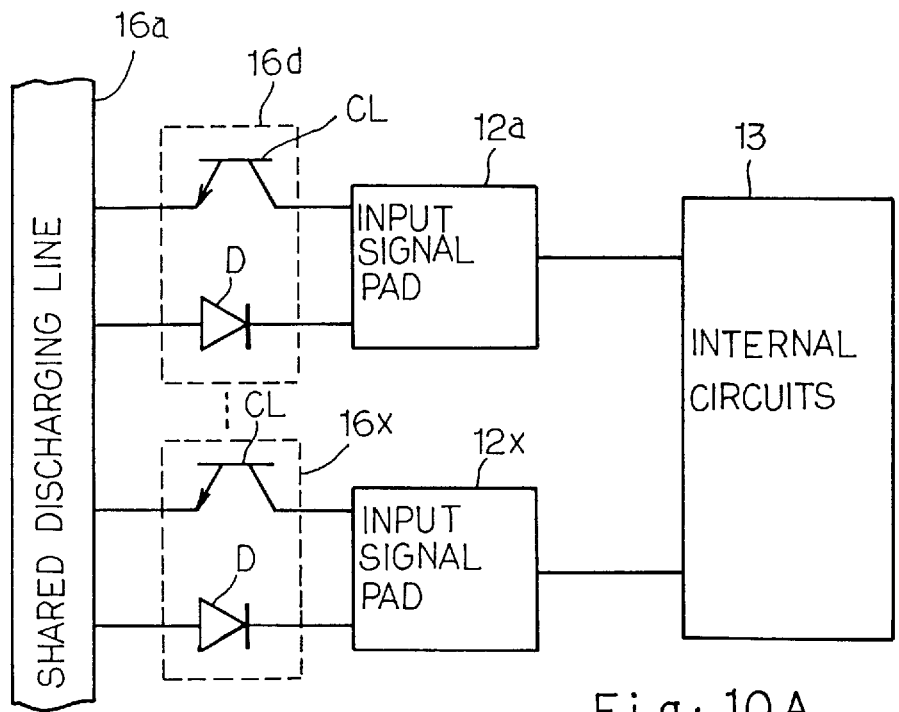
FIGS. 10A and 10B are block diagrams showing the discharging paths created in the protection system incorporated in the semiconductor integrated circuit device upon application of surge voltage.
Figure 10B:
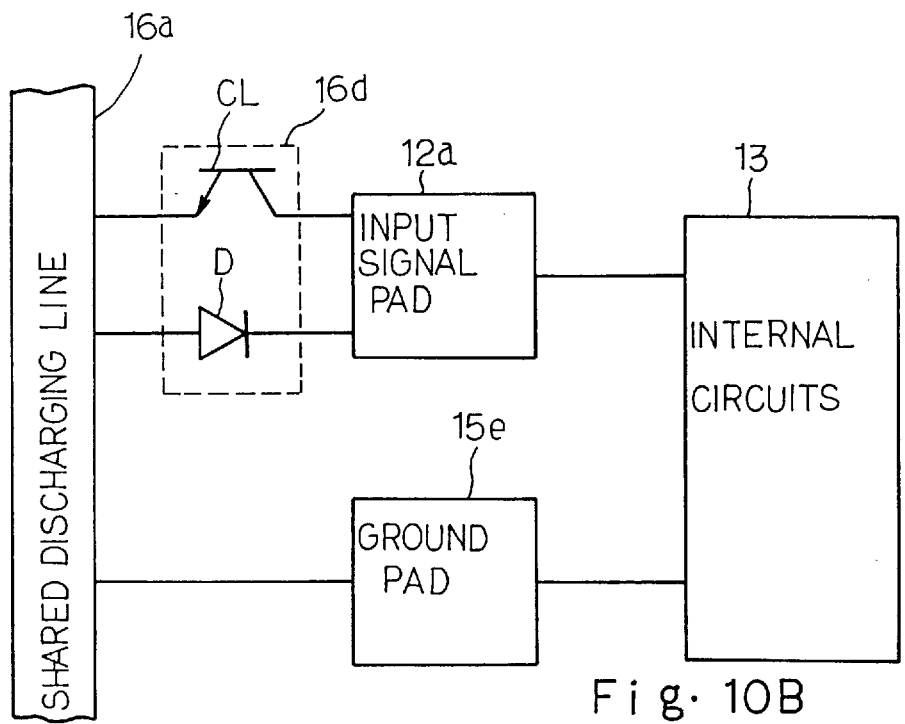

Assuming now that positive surge voltage and negative surge voltage are applied to the input signal pad 12a and another input signal pad 12x associated with the protective unit 16x shown in FIG. 10A. The positive surge voltage is discharged from the input signal pad 12a through the clamping element CL of the protective unit 16d to the shared discharging line 16a and is, in turn, supplied from the shared discharging line 16a through the diode D of the protective unit 16x.

If the positive surge voltage is applied to the input signal pad 12x, the positive surge voltage is discharged through the clamping element CL of the protective unit 16x to the shared discharging line 16a and is, in turn, supplied from the shared discharging line 16a through the diode D of the protective unit 16d to the input signal pad 12a.

When the positive surge voltage is applied to the input signal pad 12a, the positive surge voltage is discharged through the clamping element CL of the protective unit 16d to the shared discharging line 16a, and the shared discharging line 16a directly supplies the surge voltage to the ground pad 15e.

On the other hand, when negative surge voltage is applied to the input signal pad 12a, the negative surge voltage passes through the diode D of the protective unit 16d to the shared discharging line 16a and, accordingly, to the ground pad 15e.

Thus, the surge voltage passes through only one clamping element CL and only one diode D or through only one clamping element Cl or only one diode D, and small potential difference is merely applied to a gate insulating film of a component field effect transistor forming a part of the main circuit. The maximum potential difference is the total of the clamping voltage of the clamping element CL, the built-in potential of the diode D and the resistance of the shared discharging line 16a. As described hereinbefore, the clamping voltage is about 7 volts, and the built-in potential is about 0.9 volt. The maximum resistance of the shared discharging line 16a is only 3 ohms, and the shared discharging line 16a steps down the voltage level therealong by only 3 volts against a peak surge current of 1 ampere. Therefore, the maximum potential difference is about 12 volts, and is smaller than the breakdown voltage of the gate insulating film equal to or greater than 100 angstroms. Thus, the protective system according to the present invention is effective against the surge voltage, and the component field effect transistors are never broken down.

The protective system 16 is further effective against electrostatic charge at the package (not shown) of the semiconductor integrated circuit device. If the package is charged, all of the conductive portions in the semiconductor chip 11 accumulate electric charge, and the power supply lines 15d and 15j and the earth lines 15f and 15m accumulate large amount of electric charge, because the power supply lines and the earth lines are the largest in area of all. If the accumulated electric charge is, by way of example, discharged through the input signal pad 12a to an external conductive member, the electric charge accumulated in the power supply line 15d flows from the power supply pad 15c through the clamping element CL of the protective unit 16c, the shared discharging line 16a and the diode D of the protective unit 16d to the input signal pad 12a. Similarly, the electric charge accumulated in the earth line 15f is discharged through the shared discharging line 16a and the diode D of the protective unit 16d to the input signal pad 12a. Thus, the electric charge passes through only the clamping element CL and the diode D, and is rapidly discharged without destruction of the circuit components of the main circuit.

As will be appreciated from the foregoing description, the protective system 16 according to the present invention decreases the potential difference applied across the gate insulating films of the component field effect transistors and effectively prevents the circuit components of the main circuit from destruction.

Although the particular embodiment of the present invention has been shown and described, it will be obvious to those skilled in the art that various changes and modifications may be made without departing from the spirit and scope of the present invention. For example, either positive or negative voltage may bias the semiconductor substrate.

What is claimed is:

1. A semiconductor integrated circuit device constructed on a semiconductor chip, comprising:
   a) a main circuit having an input port for receiving an input signal, and responding to said input signal to produce an output signal;
   b) an output circuit having an output port for transferring said output signal to outside of said semiconductor integrated circuit device;
   c) a power supply system having a first power supply subsystem for supplying a first power voltage and a second power voltage to said main circuit and a second power supply subsystem for supplying said first power voltage and said second power voltage to said output circuit, said first power supply subsystem comprising a first power supply port and a second power supply port said second power supply subsystem comprising a third power supply port and a fourth power supply port, wherein said first power supply port and said second power supply port are electrically isolated from said third power supply port and said fourth power supply port; and
   d) a protective system further comprising:
      d-1) a shared discharging line, and
      d-2) a plurality of protective units wherein one protective unit is physically connected between said shared discharging line and each of said input port, said output port, said first power supply port, said third power supply port and said fourth power supply port, and each of said protective units is operative to discharge said surge voltage from said input port, said output port, said first power supply port, said third power supply port and said fourth power supply port to said shared discharging line.

2. The semiconductor integrated circuit device as set forth in claim 1, wherein said shared discharging line comprises a scribe line electrically connected with said semiconductor chip.

3. The semiconductor integrated circuit device as set forth in claim 1, wherein each of said protective units consists of a parallel combination of a diode and a clamping element, said diode having an anode connected with said shared discharging line and a cathode connected with the port associated with said protective unit, said clamping element allowing a positive surge voltage to flow from said associated port to said shared discharging line.

4. The semiconductor integrated circuit device as set forth in claim 3, said diode further comprising:
   a first impurity region having a first conductivity type electrically connected with an associated port; and
   a first part of said semiconductor chip having a second conductivity type electrically connected with said shared discharging line, and
said clamping element further comprising:
   said first impurity region;
   a second part of said semiconductor chips; and
   a second impurity region having said first conductivity type spaced from said first impurity region by said second part of said semiconductor chip, wherein said second impurity region is electrically connected with said shared discharging line.

5. The semiconductor integrated circuit device of claim 1 wherein said protective units dissipate surge voltage to said shared discharging line when said main circuit is being operated.

6. A semiconductor integrated circuit device comprising:
   at least one each of an input terminal and an output terminal connected to at least one internal circuit,
   a first power supply system;
   a second power supply system;
   a discharging line common to said input terminal, said output terminal, said first power supply system, and said second power supply system; and
   a protective unit physically connected between each said input terminal and output terminal and said discharging line to dissipate excess charge to said discharging line when said internal circuit is being operated.

7. A semiconductor device comprising:
   a first power supply pad supplied with a power voltage;
   a second power supply pad supplied with said power voltage;
   a common discharging line;
   a first protective unit connected at one end thereof to said common discharging line and at the other end thereof to said first power supply pad;
   a second protective unit connected at one end thereof to said common discharging line and at the other end thereof to said second power supply pad;
   a first internal wiring independent of said first and second protective units and connecting said first power supply pad to an internal circuit, and
   a second internal wiring independent of said first and second protective units and connecting said second power supply pad to said internal circuit;
   said first and second protective units respectively having protective elements serving as a minimum unit for achieving a protective function by dissipating excess charge to said common discharging line when said internal circuit is being operated, said protective elements being connected between said one end and said other end of respective protective units without another protective element.

8. The semiconductor device as set forth in claim 7, in which each of said first and second protective units consists of a clamping element and a diode element, each of said clamping element and said diode element connected between said one end and said other end of respective protective units.

9. The semiconductor device of claim 7, wherein each of said first and second internal wirings is independent of said internal circuit.

10. A semiconductor device comprising:

an internal circuit;

a plurality of pads;

a plurality of internal wirings connecting said plurality of pads to said internal circuit, respectively;

a common discharging line formed in an area different from another area assigned to said internal circuit and yet another area assigned to said plurality of internal wirings; and a plurality of protective circuits connected between said common discharging line and said plurality of pads, respectively, to achieve a protective function by dissipating excess charge to said common discharging line when said internal circuit is being operated.

11. The semiconductor device as set forth in claim 10, in which each of said plurality of protective circuits includes a protective element serving as a minimum unit for achieving a protective function, and said protective element is connected between said common discharging line and said respective pad without another protective element.

12. The semiconductor device as set forth in claim 10, in which said common discharging line is implemented by a scribe wiring.

13. The semiconductor device as set forth in claim 10, in which said plurality of pads includes at least a first power supply pad supplied with a power voltage and a second power supply pad supplied with said power voltage.

14. A semiconductor device comprising:

a common discharging line forming a closed loop;

an internal circuit formed inside of said closed loop;

a plurality of pads provided between said internal circuit and said common discharging line;

a plurality of electrostatic protective means respectively connecting said plurality of pads to said common discharging line to achieve a protective function by dissipating excess charge to said common discharging line when said internal circuit is being operated; and a plurality of internal wirings respectively connecting said plurality of pads to said internal circuit.

15. The semiconductor device as set forth in claim 14, in which said common discharging line is implemented by a scribe wiring arranged in the peripheral portion of a chip.

* * * * *